(12) United States Patent
Edelson et al.

(10) Patent No.: US 10,283,970 B2
(45) Date of Patent: May 7, 2019

(54) DYNAMIC EXCHANGE OF ELECTRICAL CURRENT CONTROL DEVICES IN A LOAD CURRENT CONTROLLER

(71) Applicant: Analog Devices, Inc., Norwood, MA (US)

(72) Inventors: Lawrence H. Edelson, Fremont, CA (US); Michael Daly, San Jose, CA (US); Marcus O'Sullivan, San Jose, CA (US)

(73) Assignee: Analog Devices, Inc., Norwood, MA (US)

( * ) Notice: Subject to any disclaimer, the term of this patent is extended or adjusted under 35 U.S.C. 154(b) by 238 days.

(21) Appl. No.: 15/207,238

(22) Filed: Jul. 11, 2016

(65) Prior Publication Data

US 2018/0013294 A1    Jan. 11, 2018

(51) Int. Cl.
| | |
|---|---|
| *H03M 1/66* | (2006.01) |
| *H02J 4/00* | (2006.01) |
| *H02H 9/00* | (2006.01) |
| *H03K 17/082* | (2006.01) |
| *H03K 17/16* | (2006.01) |
| *H02H 9/02* | (2006.01) |

(52) U.S. Cl.
CPC ............. *H02J 4/00* (2013.01); *H02H 9/001* (2013.01); *H03K 17/0822* (2013.01); *H03K 17/162* (2013.01); *H03M 1/66* (2013.01); *H02H 9/025* (2013.01); *H03K 2217/0027* (2013.01)

(58) Field of Classification Search
CPC ............ H02J 4/00; H03M 1/66; H02H 9/001; H02H 9/025

USPC ......................................................... 307/113
See application file for complete search history.

(56) References Cited

U.S. PATENT DOCUMENTS

| | | | |
|---|---|---|---|
| 5,351,162 A * | 9/1994 | Koishikawa | H03K 17/08122 307/39 |
| 6,396,249 B1 * | 5/2002 | Itakura | H03K 17/0822 323/273 |
| 6,930,473 B2 | 8/2005 | Elbanhawy | |
| 7,253,540 B1 | 8/2007 | Thalheim et al. | |
| 8,148,957 B2 | 4/2012 | Zhang | |
| 8,278,997 B1 | 10/2012 | Kim et al. | |

(Continued)

OTHER PUBLICATIONS

U.S. Appl. No. 13/253,444, U.S. Pat. No. 8,680,893, filed Oct. 5, 2011, Circuits and Techniques for Load Current Control.

(Continued)

*Primary Examiner* — Dinh T Le
(74) *Attorney, Agent, or Firm* — Schwegman Lundberg & Woessner, P.A.

(57) ABSTRACT

In an example, a circuit for controlling at least two electronic switches in a parallel configuration between a power supply and a load. The circuit includes a control circuit to generate first and second control signals to control first and second electronic switches of the at least two electronic switches, and establish a conduction sequence of the first and second electronic switches using the first and second control signals. The circuit includes a detection circuit configured to detect a current flowing through a control terminal of the first electronic switch during a transition portion, wherein the circuit is configured to adjust the first control signal and establish the second portion of the conduction sequence in response to the detected current.

22 Claims, 11 Drawing Sheets

(56) References Cited

U.S. PATENT DOCUMENTS

| | | |
|---|---|---|
| 8,680,893 B2 | 3/2014 | Spalding, Jr. et al. |
| 2011/0109297 A1 | 5/2011 | Tosuntikool |
| 2011/0248748 A1* | 10/2011 | Koto .................. G01R 19/0092 327/108 |
| 2012/0313687 A1* | 12/2012 | Togneri .............. H03K 17/0822 327/404 |
| 2013/0088278 A1 | 4/2013 | Spalding, Jr. et al. |
| 2015/0015300 A1 | 1/2015 | Simonson et al. |
| 2015/0016005 A1 | 1/2015 | Simonson et al. |

OTHER PUBLICATIONS

"U.S. Appl. No. 13/253,444, Response filed Jul. 29, 2013 to Non Final Office Action dated Feb. 28, 2013", 13 pgs.

"U.S. Appl. No. 13/253,444, Non Final Office Action dated Feb. 28, 2013", 12 pgs.

"U.S. Appl. No. 13/253,444, Notice of Allowance dated Nov. 7, 2013", 15 pgs.

* cited by examiner

DYNAMIC EXCHANGE OF ELECTRICAL CURRENT CONTROL DEVICES IN A LOAD CURRENT CONTROLLER

RELATED APPLICATIONS

This application is related to U.S. patent application Ser. No. 13/253,444, titled "CIRCUITS AND TECHNIQUES FOR LOAD CURRENT CONTROL," filed on Oct. 5, 2011 to Spalding et al., and issued as U.S. Pat. No. 8,860,893), which is hereby incorporated by reference herein in its entirety.

TECHNICAL FIELD

This disclosure relates generally to a connection device for enabling power to be supplied to an electrical load.

BACKGROUND

There are instances when it is desired to connect an electrical load to a power supply that is already on. This can give rise to large in-rush currents as capacitive components of the load charge up. Such capacitive components may be real or parasitic components.

These in-rush currents can perturb the operation of the power supply, possibly causing protective measures within the power supply to trip. Furthermore, the in-rush currents may introduce perturbations in the power supplied to other loads connected to the power supply, and these perturbations may affect the operation of those circuits. In addition, if the newly introduced load is faulty, its fault may also affect the operation of the power supply and the other loads or circuits connected to the supply.

In order to address these issues, it is known to provide "hot swap" circuits that regulate or control the current flow to a load that is newly introduced to a power supply.

SUMMARY OF THE DISCLOSURE

In some examples, this disclosure is directed to a circuit for controlling at least two electronic switches in a parallel configuration between a power supply and a load. The circuit includes a control circuit configured to generate a first control signal to control a first electronic switch of the at least two electronic switches, generate a second control signal to control a second electronic switch of the at least two electronic switches, and establish a conduction sequence of the first and second electronic switches using the first and second control signals. The conduction sequence includes a first portion during which the first electronic switch conducts at least some of a current from the power supply to the load, a second portion during which the second electronic switch conducts the at least some of a current from the power supply to the load, and a transition portion between the first and second portion during which both the first and second electronic switches conduct at least some of the current from the power supply to the load. The circuit includes a detection circuit configured to detect a current flowing through a control terminal of the first electronic switch during the transition portion, wherein the circuit is configured to adjust the first control signal and establish the second portion of the conduction sequence in response to the detected current.

In some examples, this disclosure is directed to a method for controlling at least two electronic switches in a parallel configuration between a power supply and a load. The method includes establishing a conduction sequence of a first electronic switch of the at least two electronic switches and a second electronic switch of the at least two electronic switches using first control signal in communication with the first electronic switch and a second control signal in communication with the second control signal. the conduction sequence includes a first portion during which the first electronic switch conducts at least some of a current from the power supply to the load, a second portion during which the second electronic switch conducts at least some of the current from the power supply to the load, and a transition portion between the first and second portion during which both the first and second electronic switches conduct the current from the power supply to the load. The method includes detecting a current flowing through a control terminal of the first electronic switch during the transition portion, and adjusting the first control signal and establishing the second portion of the conduction sequence in response to the detected current.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

This disclosure describes techniques to sequence, e.g., time multiplex, two or more electronic switches to share the SOA restriction across the switches. More particularly, using the techniques of this disclosure, current from a control terminal of an electronic switch, e.g., current from a gate of a field-effect transistor, can be detected during a transition portion of a conduction sequence between first and second portions of the conduction sequence and, in response to the detected current, a control signal to a first electronic switch can be adjusted to establish the second portion of the conduction sequence. In this manner, the techniques of this disclosure can detect the transition from the first electronic switch to the second electronic switch and terminate the exchange process, e.g., to "handoff" control to from the first electronic switch to a second electronic switch.

There are instances when it is desirable to connect an electrical load to a power supply that is already on. As capacitive components (real or parasitic) in the load charge up, large inrush currents can be generated. These inrush currents can perturb the operation of the power supply, which can trip protective measures within the power supply. Furthermore, the inrush currents may introduce perturbations in the power supplied to other loads connected to the power supply, and these perturbations may affect the operation of those circuits. If the newly introduced load is faulty, its fault may also affect the operation of the power supply and the other loads or circuits connected to the supply. In order to address these issues, "hot swap" circuits can be included that regulate the current to a load that is newly introduced to a power supply, an example of which being described below with respect to FIG. 1.

Figure 1:
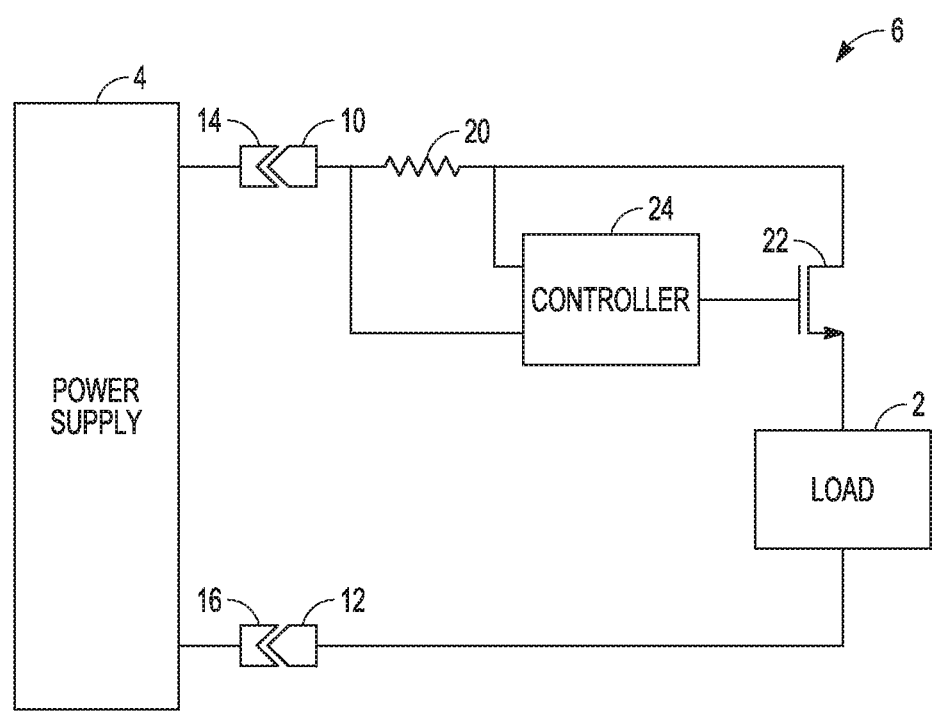
FIG. 1 is an example of an existing hot swap circuit for enabling a load to be connected to a power supply.

FIG. 1 illustrates an existing hot swap circuit for enabling a load 2 to be connected to a power supply 4. It is to be assumed that the power supply may also be supplying other components which have been omitted for simplicity. The hot swap circuit is generally designated 6 and in this arrangement is physically associated with the load 2. The combination of the load 2 and hot swap circuits 6 can be electrically connected to or disconnected from the power supply by making or breaking connections between plug components 10 and 12 and respective sockets 14 and 16 which are connected to the power supply 4.

A system current sensing resistor 20 and an electrically controllable current flow or control device 22 (or electronic switch) can be provided in series between the plug and the load 2. The electrical current flow device 22 can be transistor, e.g., a N-type field effect transistor. A controller (or control circuit) 24 can include first and second inputs connected to either side of the current sensing resistor 20 and an output connected to the gate of the field effect transistor 22.

In use, when the load 2 and hot swap circuit 6 are introduced to the power supply 4 by virtue of the plugs 10 and 12 being introduced to the respective sockets 14 and 16, then the voltage of the power supply can be provided to the controller 24, thereby powering it up and also initiating the power up sequence for the load 2. The controller 24 can apply a control signal to a control terminal of the switch 22, e.g., the gate of the field effect transistor 22 in order to enable current flow to the load 2. The controller 24 can monitor the voltage occurring across the current sensing resistor and, in a closed loop, can control the gate voltage of the transistor 22 such that the rate of change of current $$\frac{\partial I}{\partial t}$$

can be controlled to a target value or the magnitude of the current can be controlled to a target value. This can prevent excessive inrush currents being drawn by the load. The load can be assumed to be fully powered when it is no longer possible to get the rate of current increase or the current to attain the target value.

A problem with such an arrangement can be that a large amount of power may be dissipated in the transistor 22 during the inrush control period. To put this in context, it can be seen that when the load is fully powered, although the currents flowing through the transistor 22 may be quite high, the voltage across the transistor can be very small. Thus, the amount of energy dissipated in the transistor can be quite low. In fact, for modern switching field effect transistors, the drain to source on resistance may be in the order of just a few milli-ohms. Consequently, the power dissipation as given by $I^2R$ remains low. Similarly, it can be seen that if the transistor was fully off, then although the voltage across the transistor might be quite high, the current through it would be zero and consequently there would be no dissipation. However, during the period when the transistor is performing inrush current limiting, the currents through the transistor 22 may be quite high, and the voltage across the transistor may be quite significant. Under such circumstances, the power dissipation within the transistor may be sufficiently high to warm the device such that it becomes thermally stressed. Thermal stressing is a product of the amount of power being dissipated in the transistor and the time for which that power is dissipated.

Commonly assigned U.S. Pat. No. 8,680,893 discloses an improvement in a "hot swap" application that can allow the use of multiple electrically controllable current flow devices (electronic switches) in sequence to share the power dissipation during a hot swap transition. The techniques disclosed in U.S. Pat. No. 8,680,893 include an enhancement to a control circuit that maintains the device within a safe operating area ("SOA") by using multiple devices to continue the load. There is no presumption that the inrush current control has been completed at the end of a first period representing a first duration for which the first electronic switch can be safely used, as determined by a designer. Consequently, the responsibility for controlling the current to the load for a second duration is passed from the first electronic switch to at least a second electronic switch. Commonly assigned U.S. Pat. No. 8,680,893 mentions the concept of sequencing, e.g., "time multiplex", multiple electronic switches, e.g., semiconductor devices such as transistor, to share the SOA restriction across multiple devices, described below with respect to FIG. 2.

Figure 2:
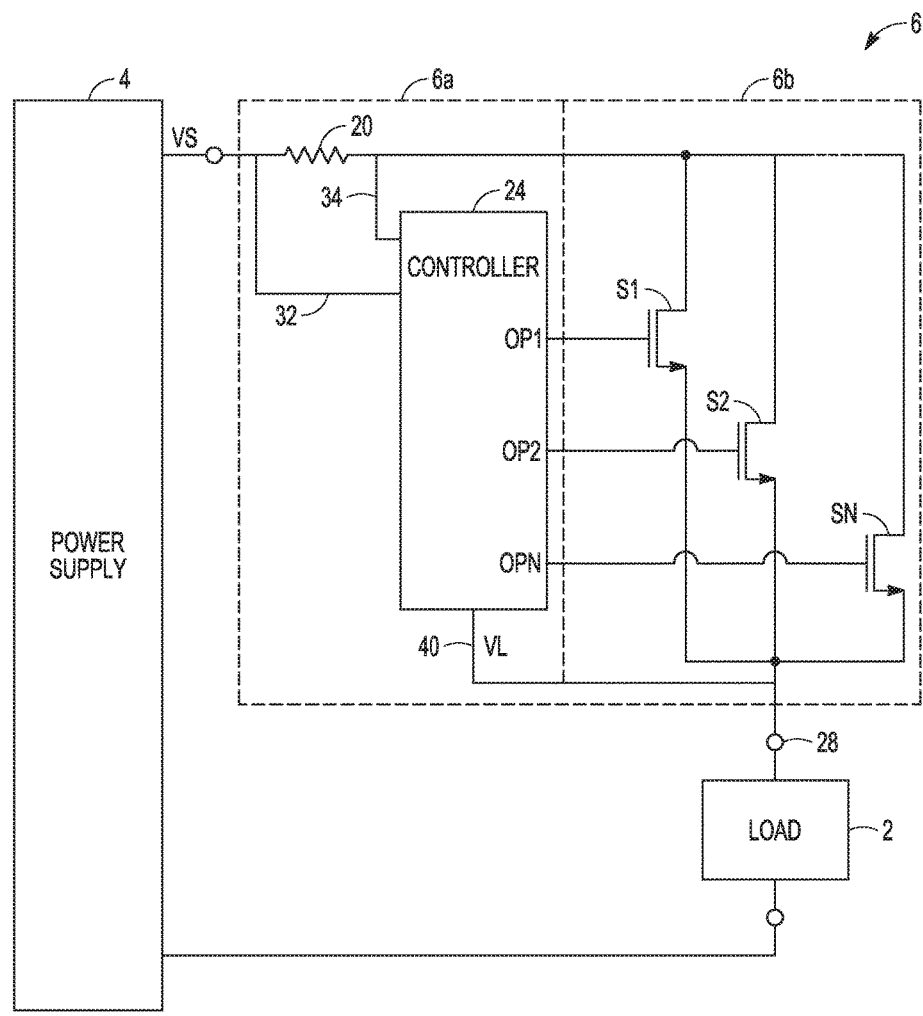
FIG. 2 is a circuit diagram of a connection device that can be used to sequence multiple electronic switches and implement various techniques of this disclosure.

FIG. 2 is a circuit diagram of a connection device that can be used to sequence multiple electronic switches and implement various techniques of this disclosure. The connection device 6 has been drawn as being separate from either the load 2 or the power supply 4. This is to indicate that the connection device 6 may be a stand-alone component. Alternatively it may be integrated into the load 2, as shown in FIG. 1, or form part of the power supply 4. Where the connection device 6 is associated with the load, for example by being part of it, the controller 24 is allowed to power up whilst holding the semiconductor devices S1 to SN in a non-conducting state (or cut-off state). Once the controller has powered up, it may then proceed to control the operation of the semiconductor devices to power up the load. That is, the controller can generate respective control signals to control the switches S1, S2, etc. to vary between cut-off states and fully-on-states.

The connection device can itself be divided down into a control module 6a and a current switching/limiting module 6b and these modules may be separable and may be embedded in other components. Thus the control module 6a can be provided as part of the power supply and the current switching/limiting module 6b can be provided as part of the load.

As shown FIG. 2, a plurality of devices S1, S2 to SN are provided in parallel thereby providing parallel current paths from a supply rail 26 to an output node 28 connected to the load 2. Two or more parallel switches can be used. As described in detail below, this disclosure describes techniques to sequence, e.g., time multiplex, two or more electronic switches, e.g., devices S1, S2 to SN, to share the SOA restriction across multiple devices. More particularly, using the techniques of this disclosure, current through a control terminal of an electronic switch, e.g., current from a gate of a field-effect transistor, can be detected during a transition portion of a conduction sequence between first and second portions of the conduction sequence and, in response to the detected current, a control signal to a first electronic switch can be adjusted to establish the second portion of the conduction sequence. In this manner, the techniques of this disclosure can detect the transition from the first electronic switch, e.g., switch S1 in FIG. 2, to the second electronic switch, e.g., switch S2 in FIG. 2, and terminate the exchange process between a first and second switch, e.g., to "handoff" control to from the first electronic switch to a second electronic switch.

In some example implementations, a system current sensing resistor 20 can be provided in the supply rail between the power supply 4 and semiconductor devices S1 to SN, like in the configuration of FIG. 1. Detecting the conditions of the two or more electronic switches, e.g., devices S1, S2 to SN, during the transition period, in order to apply correct control signals, can be achieved using feedback from the system current sensor, where available. The system current sensor can detect when the current flow changes through the electronic switches and the control signals can be adjusted to manage the transition appropriately.

However, it may be possible that the system current sensing resistor 20 is not available or the signal from the sensing resistor 20 is not sufficient to provide adequate feedback. In such instances, using various techniques of this disclosure, detection circuitry that does not include the system current sensing resistor 20 can be used to detect when the current flow changes through the electronic switches and the control signals can be adjusted to manage the transition appropriately.

The controller 24 can include a first input 32 connected to a first side of the current sensing resistor 20 and a second input 34 connected to the second side of the sensing resistor 20. The controller can measure the voltage across the current sensing resistor 20 and thereby determine the current flow to the load 2. The controller can also measure the voltage occurring at either of the inputs 32 or 34 in order to determine when it has been connected to the power supply 4. This can be more relevant for circuits that are provided as stand-alone units compared to those which are provided as part of the load.

The controller can include first to Nth device control outputs OP1 to OPN. The first output OP1 can be connected to a control terminal of the first electronic switch S1. The second output OP2 can be connected to a control terminal of the second electronic switch S2. If more than two devices are provided, than the further outputs up to OPN can be connected to the associated switches up to SN. In the specific non-limiting example of FIG. 2, the switches S1 to SN can be field effect transistors having sources, drains and gates. The output OP1 from the controller can be connected to the gate terminal of the transistor S1. The drain of S1 can be connected to the supply rail 26 and the source of S1 can be connected to the output node 28. The other transistors S2 up to SN are similarly connected.

Optionally, the controller can include a third input 40 connected to the output node 28 for measuring a voltage VL occurring across the load 2.

Once the load is introduced into the circuit such that current flow can occur between the power supply 4 and the load 2, the connection device 6 can begin current control during a first predetermined period. The first predetermined period can start as soon as current flow to the load becomes possible. During this time the controller 24 can monitor the current flowing to the load by virtue of monitoring the voltage occurring across the current sensing resistor 20.

Optionally, if the input 40 is connected to the output node 28, then the controller 24 can also monitor the voltage across the load 2. The controller can attempt to control the flow of current or optionally the rate of change of current flow to the load. This can mean that the voltage at node 28 will take some time to rise from zero to the power supply voltage Vs. The rise time permitted may be set by system designer. In example configurations that utilize the system current sense resistor 20 for system current control, the expected voltage across the current sensing resistor 20 should rise at a predetermined rate at as the current flow to the load increases. This voltage can be monitored and controlled in a closed loop by controlling the gate voltage supplied to whichever one of the transistors S1 to SN is passing current at the tune.

As can be seen, rather than having a single semiconductor device, such as FET 22 as shown in FIG. 1, the circuit of FIG. 2 can include multiple current control devices S1 to SN. These can be activated by the controller 24 in a sequential, but interleaved manner. For example, the controller 24 can generate a first control signal to a control terminal of the switch S1, e.g., the gate of a field effect transistor, in order to enable current flow to the load 2, then can generate a second control signal to a control terminal of the switch S2, e.g., the gate of a field effect transistor, then (if present) can generate a third control signal to a control terminal of the switch S3, e.g., the gate of a field effect transistor. As shown in 3, for example, the controller 24 can establish a conduction sequence of the first and second electronic switches, e.g., switches S1 and S3, using the first and second control signals, where the conduction sequence includes a first portion during which the first electronic switch conducts substantially all of a current from the power supply to the load, a second portion during which the second electronic switch conducts substantially all of the current from the power supply to the load, and a transition portion between the first and second portion during which both the first and second electronic switches conduct the current from the power supply to the load.

In this manner, the thermal stress caused during the hot swap power up event does not need to be endured by a single transistor, but can be shared between two or more transistors. This can allow the circuit designer to use transistors that are optimized for their low on resistance in the fully on state, which constitutes the vast majority of their working life, whilst ensuring that the transistors do not become damaged during a hot swap power up event.

As mentioned above and as described in detail below, this disclosure describes techniques to sequence, e.g., time multiplex, two or more electronic switches to share the SOA restriction across multiple devices. More particularly, using the techniques of this disclosure, current through a control terminal of an electronic switch, e.g., current from a gate of a field-effect transistor, can be detected during a transition portion of a conduction sequence between first and second portions of the conduction sequence and, in response to the detected current, a control signal to a first electronic switch can be adjusted to establish the second portion of the conduction sequence. In this manner, the techniques of this disclosure can detect the transition from the first electronic switch, e.g., switch S1 in FIG. 2, to the second electronic switch, e.g., switch S2 in FIG. 2, and terminate the exchange process between a first and second switch, e.g., to "handoff" control to from the first electronic switch to a second electronic switch.

Figure 3:
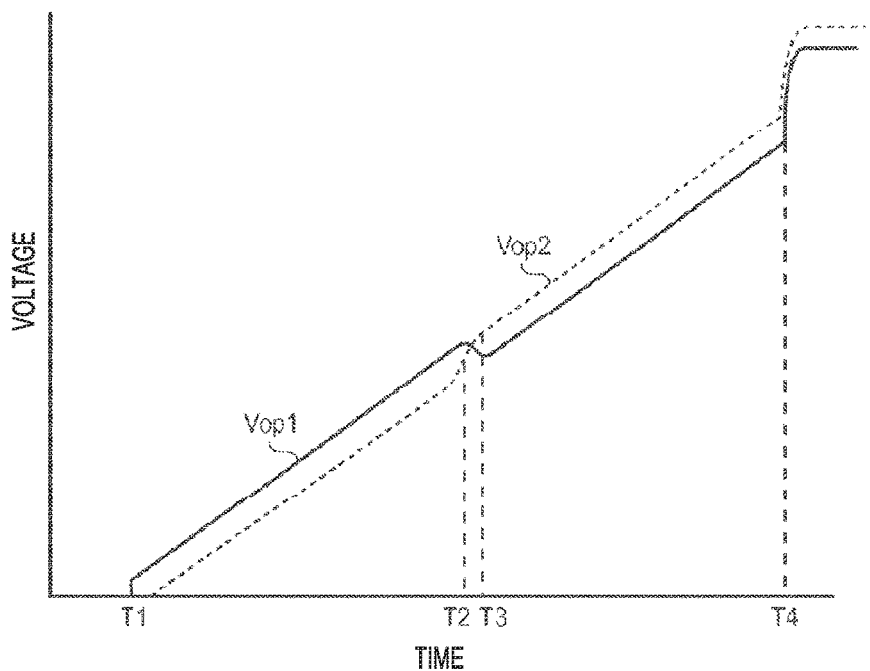
FIG. 3 illustrates a conduction sequence between two electronic switches and depicts the evolution of the voltages VOP1 at the output OP1 and VOP2 at the output OP2 in FIG. 2 as a function of time for a circuit.

FIG. 3 illustrates a conduction sequence between two electronic switches and depicts the evolution of the voltages VOP1 at the output OP1 and VOP2 at the output OP2 in FIG. 2 as a function of time for a circuit. Time is represented on the x-axis and voltage is represented on the y-axis.

FIG. 3 depicts the gate voltages with respect to ground. In the example in FIG. 3, assume S1 and S2 are pure followers and S1 and S2, e.g., FETs, are matched devices. The common source voltage (not depicted) would be from time T1-T2, following approximately a Vgs below voltage VON. Voltage VOP2 is at a voltage that is above the common source voltage, but is less than a threshold above so switch S2 is non-conducting. The difference between voltage VOP1 and voltage VOP2 in T1-T2 interval is referred to in this disclosure as $V_{delta}$.

A first portion of the conduction sequence is shown between time T1 and time T2, where the first portion is during which the first electronic switch conducts substantially all of a current from the power supply to the load. A transition portion of the conduction sequence is shown between time T2 and time T3, during which both the first and second electronic switches conduct the current from the power supply to the load, e.g., the first electronic switch is "handing off" control to the second electronic switch. A second portion of the conduction sequence is shown between time T3 and time T4, where the second electronic switch conducts substantially all of the current from the power supply to the load. The exchange process between the first electronic switch and the second electronic switch is terminated at the second portion.

Following introduction of a load to the power supply at time T1, the output voltage VOP1 supplied to the first switch S1 can rise substantially uniformly during the first period extending between T1 and T2. VOP2 can track VOP1, but at a reduced value. At time T2, a voltage ramps from a negative value to a positive value such that VOP2 becomes greater than VOP1. During the transition period T2 to T3, the rate of change of VOP2 can be greater than that of VOP1 and at some point in this period, the transistor S2 can begin to conduct and current flow transitions from being via transistor S1 to being via transistor S2 such that by time T3 all of the current flow is via the transistor S2. VOP2 can then continue to evolve from T3 until such time as the node is fully powered at T4 where the voltage across the load has reached that of the supply voltage. At this time the transistor S2 is driven hard on as the control loop tries, and fails, to keep the current to the load at the current limit reference value. The voltage drop across S2, and indeed across S1, becomes negligible.

Using the techniques of this disclosure, current from a control terminal of the first electronic switch, e.g., current from a gate of a field-effect transistor, can be detected during the transition portion of the conduction sequence between first and second portions of the conduction sequence and, in response to the detected current, a control signal to the first electronic switch can be adjusted to establish the second portion of the conduction sequence. In this manner, the techniques of this disclosure can detect the transition from the first electronic switch to the second electronic switch and terminate the exchange process, e.g., to "handoff" control to from the first electronic switch to a second electronic switch.

The sequencing transition between $FET_1$ and $FET_2$, as shown in FIG. 2, may be initiated at T2 by accelerating the rate of increase in the gate voltage of $FET_2$ so that it can transition from a trajectory where it can parallel but remain a threshold voltage ($V_{th}$) below the gate voltage of $FET_1$ and can move to a trajectory where it can intersect the gate voltage of $FET_1$. Voltage $V_{delta}$ may be a threshold, but is not required to be a threshold below gate voltage of $FET_1$. If the FETs are matched (for simplicity), the gate voltage of $FET_2$ can be sufficiently below the gate voltage of $FET_1$ so that it can remain largely non-conducting. The gate voltage of $FET_2$ may not be more than a $V_{th}$ below gate voltage of $FET_1$ because then it might be below the common source voltage and may risk forward biasing any protection diodes.

In accordance with various techniques of this disclosure, this intersection can be detected in the controller 24 (FIG. 2) as an electrical current that derives from the displacement charge on the control terminal of the first electronic switch, e.g., gate capacitance $C_{gs}$ of $FET_1$ as the common source voltage of $FET_1$ and $FET_2$ begins to track the more rapidly changing gate voltage of $FET_2$. In some example circuit configurations, as the common source voltage moves to track $FET_2$, the controller on the gate of $FET_1$ can work against a charge pump composed of $C_{gs1}$ and the rising source voltage and will need to remove charge from the gate of $FET_1$ to maintain the command voltage. This can appear as current flowing from the gate of $FET_1$ and, using the techniques of this disclosure, can be used to terminate the exchange process between a first electronic switch and a second electronic switch. The termination of the exchange process can stage the gate voltage of $FET_1$ a threshold voltage $V_{th}$ below the gate voltage of $FET_2$ and the hot swap function can continue with $FET_2$ bearing the load current.

Figure 4:
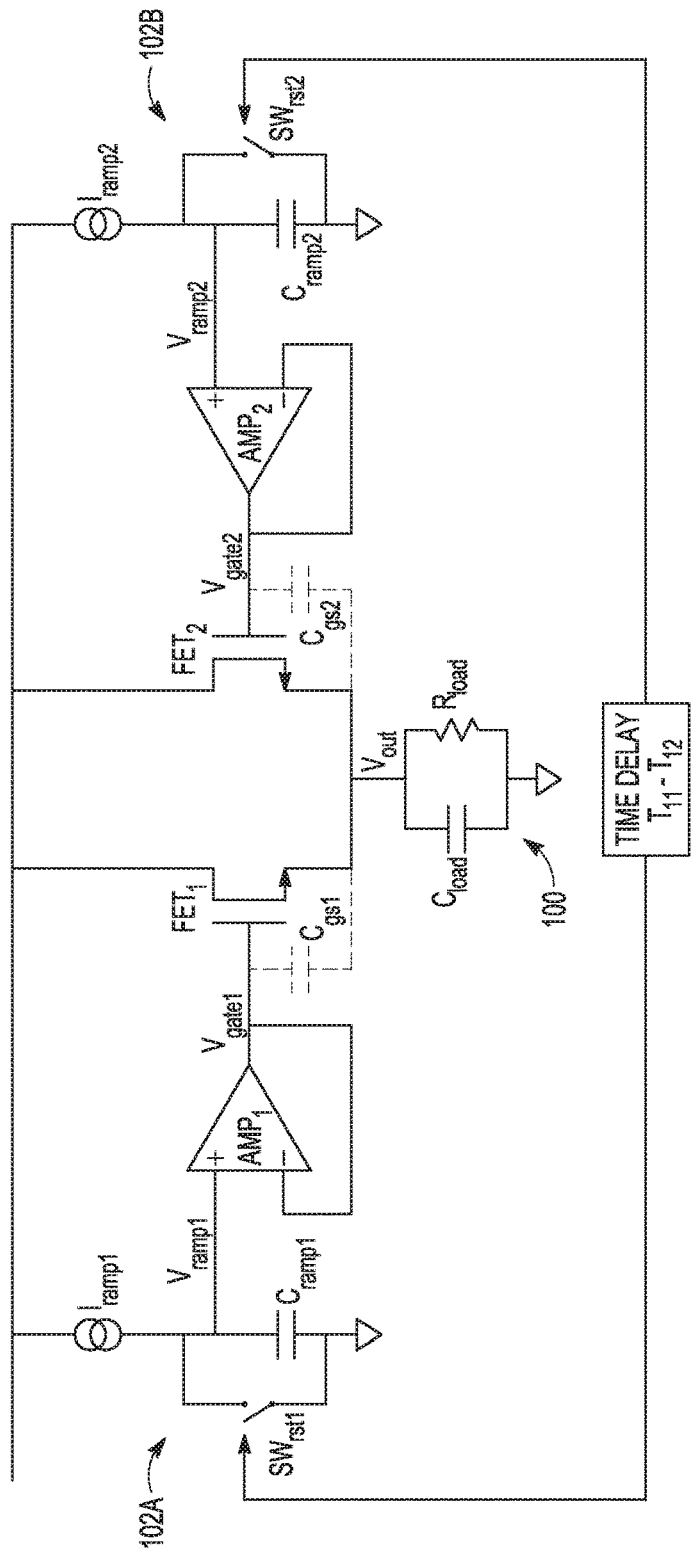
FIG. 4 is an example of a circuit that can be used to implement various techniques of this disclosure.

FIG. 4 is an example of a circuit that can be used to implement various techniques of this disclosure. In the example configuration of FIG. 4, two electronic switches, e.g., $FET_1$ and $FET_2$, are arranged in a common source configuration, with the sources of both FETs connected in common to the top of a load element. The two electronic switches shown in FIG. 4 can be similar to switches S1 and S2 in FIG. 2. The load element 100 in FIG. 4 is depicted as a parallel combination of a load capacitance, $C_{load}$, and a load resistance, $R_{load}$. The source of each of the FETs and one terminal each of $C_{load}$ and $R_{load}$ can be connected in common. The other terminal of $C_{load}$ and $R_{load}$ can be connected in common with a ground reference.

In the example configuration in FIG. 4, two independent amplifiers, $Amp_1$ and $Amp_2$ can be connected to the control terminals of the electronic switches, e.g., the gates of $FET_1$ and $FET_2$, respectively, in follower topology with the output of $Amp_1$, $FET_1$ gate, and the inverting (−) terminal of $Amp_1$ electrically connected. Likewise, the output of $Amp_2$ can be connected to the control terminal of the second electronic switch, e.g., the gate of $FET_2$, and its own inverting terminal (−). The non-inverting (+) terminals of each amplifier $Amp_1$ and $Amp_2$ can be connected to substantially similar but independent reference voltage waveform generators 102A, 102B. An example of a waveform generator may be a ramp generator that can include a constant current source, e.g., $I_{ramp1}$, connected to a first plate of a capacitor, e.g., $C_{ramp1}$, with the second capacitor plate connected to a reference ground. FIG. 4 depicts a first waveform generator 102A that includes constant current source $I_{ramp1}$ connected to a first plate of a capacitor $C_{ramp1}$ and a second waveform generator 102B that includes constant current source $I_{ramp2}$ connected to a first plate of a capacitor $C_{ramp2}$.

In some configurations, a reset switch can be connected across a capacitor of the ramp generator so that the voltage across the capacitor is maintained at 0 V until the ramp is initiated. Two reset switches are shown in FIG. 4, $SW_{rst1}$ and $SW_{rst2}$.

A first plate of a capacitor of a ramp generator, e.g., capacitor $C_{ramp1}$ of ramp generator 102A where $V_{ramp1}$ generated, can be connected to the non-inverting terminal of its respective amplifier, e.g., $Amp_1$. This type of waveform generator can produce a voltage that increases linearly in proportion to time after the reset switch is opened. In this configuration, the output of the amplifier can maintain an output voltage, e.g., $V_{gate1}$, at the control terminal of the electronic switch, e.g., the FET gate, to match the voltage at $V_{ramp1}$, and the common source output voltage ($V_{out}$) can also follow the ramp voltage $V_{ramp}$ approximate a threshold voltage $V_{th}$ lower. It should be noted that although a linear ramp waveform generator is described, other waveform generators can be used.

If the start of the ramp voltage $V_{ramp2}$ is delayed, then the ramp voltage $V_{ramp2}$ and gate voltage $V_{gate2}$ can lag below the voltage of $V_{ramp2}$. For a linear ramp, the ramp voltage $V_{ramp2}$ can be offset at a lower voltage ($V_{offset}$) than the ramp voltage $V_{ramp1}$ such that $V_{ramp2}+V_{offset}=V_{ramp1}$. The value of the offset voltage $V_{offset}$ is the slope of the ramp voltage $dV_1/dT$, where $dV_1/dt=DV_2/dt=I_{ramp}/C_{ramp}$, multiplied by the time delay ($T_{delay}$) between the two ramps, so $V_{offset}=I_{ramp}/C_{ramp}*T_{delay}$. This can produce an initial ramp as shown in FIG. 3 that exists before T2. In some examples, the voltage $V_{offset}$ can be considered the same as $V_{delay}$.

If the offset voltage $V_{offset}$ is sufficiently large, e.g., greater than the threshold voltage $V_{th}$, and assuming the FETs are ideally matched, then $FET_2$ can be essentially non-conducting and the entirety of the load current can pass through $FET_1$. It should be noted that this is just one non-limiting way of implementing the ramp shown in FIG. 3. Other techniques can replace the analog generation of the ramps of FIG. 4 with digital-to-analog voltage converters (as described below), or use an analog ramp for the ramp voltage $V_{ramp1}$ and a voltage follower and voltage offset to generate the ramp voltage $V_{ramp2}$.

It should be noted that the offset voltage at voltage $V_{th}$ is a conservative condition. Since the FET conduction may not be significant until Vgs approaches $V_{th}$, the offset voltage can be about 500 mV, for example, with a FET threshold of about 1.5V. So, the second FET could be maintained at a gate voltage of about 1V while the first FET may be at a gate voltage Vgs=Vth and be at 1.5V. This is meant as a non-limiting example.

During the initial voltage ramp $V_{ramp1}$ (assuming $C_{gs}$ of the FETs are completely discharged) the initial charge delivered by the amplifier can initially increase by a gate-to-source voltage $V_{gs}$. When $V_{gs}$ attains approximately $V_{th}+V_{overdrive}$, where $V_{overdrive}$ is an overdrive voltage used to deliver the load current to match $V_{ramp1}$, then the output voltage can rise to follow $V_{ramp1}$. For a purely capacitive load, the output current can simply be $C_{out}*(dV_{ramp1}/dt)$. For large power FETs and with a charging rate typically used in hot swap applications, the amount of overdrive voltage utilized is typically small, so it is a good approximation that the gate voltage will be a threshold voltage $V_{th}$. The gate-to-source voltage $V_{gs}$ can reach the threshold voltage $V_{th}$, and the amount of current the amplifier supplies can drop from $C_{gs}*(dV_{ramp}/dt)$ to $C_{gd}*(dV_{ramp}/dt)$.

In enhancement mode FETs, the gate-to-drain capacitance $C_{gd}$ can be much less than the gate-to-source capacitance $C_{gs}$, while $V_{out}<V_{in}-V_{th}$. This can have the result that while the drain-to-source voltage $V_{ds}$ is large, only modest gate current is needed to maintain the ramp rate at the output voltage $V_{out}$ because only a small amount of gate current is needed to charge the much smaller $C_{ds}$. Similarly, a small gate current is supplied by $Amp_2$ to maintain its ramp rate once $V_{gs2}$ attains $V_{th}-V_{delta}$. In this example, $V_{delta}=V_{th}-V_{gs}-V_{gs2}$. If $V_{gs1}-V_{gs2}$ is $V_{th}$, then $V_{delta}=0$. So, in an example where $V_{th}$ is 1.5V, $V_{gs1}=1.5V$, $V_{gs2}$ is staged at 1V, then $V_{delta}$ is 1V. If $V_{delta}$ were 500 mV, then $V_{gs2}$ would be 500 mv. If $V_{gs2}$ was 0, then $V_{delta}$ would be 0.

During the initial stage of the hot-swap function, as the output voltage $V_{out}$ is rising in the period from $T_1$ to $T_2$ in FIG. 3, the power dissipation occurs in $FET_1$. This power dissipation is given by $V_{ds}*C_{out}*dV_{out}/dt=V_{ds}*C_{out}*dV_{gate}/dt$, for an output load that is predominantly capacitive. If this rate is larger than the capacity of the packaging materials to dissipate this heat as it is generated in the FET, the FET can have limited effective operating time before its SOA limit is exceeded and irreversible damage to the FET may occur. Before this occurs, the FET exchange process, e.g., exchanging from $FET_1$ to $FET_2$, can begin.

Figure 5:
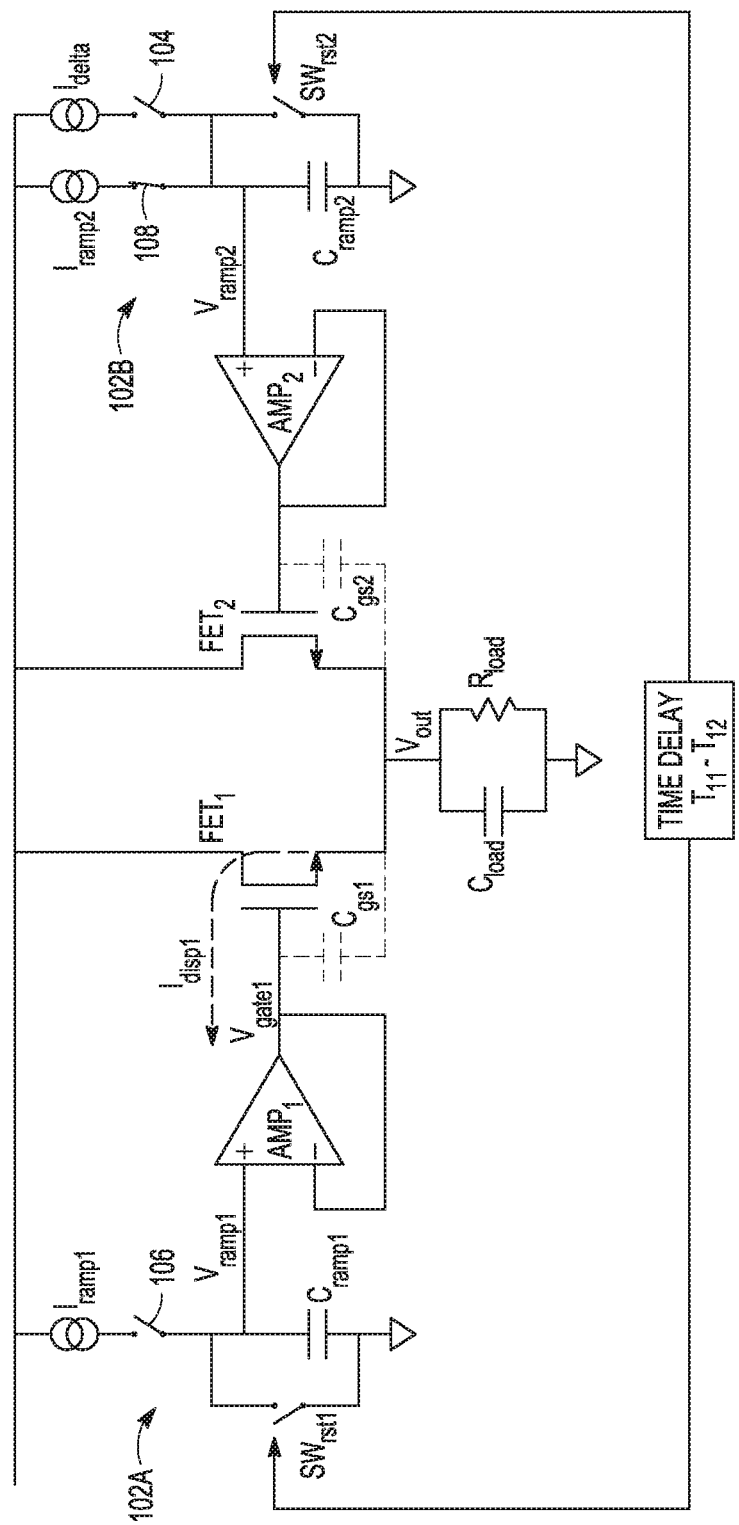
FIG. 5 is another example of a circuit that can be used to implement various techniques of this disclosure.

One technique of initiating the FET exchange process can involve controller 24 (FIG. 2) increasing the gate-to-source voltage $V_{gs2}$ of $FET_2$ at an accelerated rate so that the $FET_2$ is more strongly conducting than $FET_1$. It can be desirable that this exchange be accomplished with minimal disruption of the voltage ramp at the output voltage $V_{out}$. A possible technique is shown in FIG. 5, where an additional ramp current $I_{delta}$ is added to the first plate of $C_{ramp2}$ to accelerate the ramp rate at the gate of $FET_2$ so that it will intersect the ramp at $V_{gate}$. This is one non-limiting technique of accelerating the ramp rate at $V_{gate2}$ and a variety of other techniques may exist, which are considered within the scope of this disclosure.

It should be noted that in FIG. 4, the time delay $T_{11}$-$T_{12}$ is not the time delay between $FET_1$ and $FET_2$, but is a lag in the start to T1 of FIG. 3, which is the initiation of the soft start ramp, for each voltage ramp $V_{ramp}$. In the example configuration in FIG. 4, $I_{ramp1}=I_{ramp2}$ and $C_{ramp1}=C_{ramp2}$. The time delay $T_{11}$-$T_{12}$ can be used to produce $V_{offset}$ where $V_{offset}$ is $(T_{11}-T_{12})*I_{ramp1}/C_{ramp1}$.

FIG. 5 is another example of a circuit that can be used to implement various techniques of this disclosure. As seen in FIG. 5, an additional current source $I_{delta}$ can be included and connected via a switch 104 to a first plate of $C_{ramp2}$. Referring to FIG. 3, at time $T_2$, the rate of increase of the gate of $FET_2$ in FIG. 5 can be increased so that the rate of change $dV_{gate2}/dt$ is much greater than rate of change $dV_{gate1}/dt$. So, in the transition period $T_2$ to $T_3$ in FIG. 3, the gate voltage $V_{gate2}$ can transition such that $V_{gate2}$ is greater than the gate voltage $V_{gate1}$ at the end of the transition period. The forgoing discussion presumes that the $FET_1$ and $FET_2$ will be matched so that their threshold voltages will be equal ($V_{th1}=V_{th2}$). In practice, manufacturing variability and other circumstances can make it unlikely that their threshold voltages will be equal. In this case, the effective gate voltage can be implied so that an effective threshold gate voltage $V_{t\_eff}=V_{th}+V_{offset}$, where the offset voltage $V_{offset}$ is the voltage used to raise $FET_2$ to the same effective conductivity as $FET_1$. The offset voltage $V_{offset}$ may be either positive or negative polarity.

As the gate voltage $V_{gate2}$ reaches the effective threshold gate voltage $V_{th\_eff}$, gate voltage $V_{gate2}$ can transition from a predominantly non-conducting (e.g., cut-off) state to a strongly conducting (e.g., fully-on) state and, in the follower configuration, the output voltage $V_{out}$ can begin to follow the more rapid voltage increase rate of $V_{gate2}$. The amplifier $Amp_1$, as it tries to maintain the $V_{gate1}$ at the regulated voltage in closed-loop operation, can work against the current flowing from the control terminal of the first electronic switch, e.g., the effective displacement current $I_{disp1}$ from the gate of $FET_1$, which results when $V_{out}$ begins to track the faster slew rate $dV_{gate2}/dt$. To maintain the slew rate $dV_{gate1}/dt$, $Amp_1$ can reduce the gate-to-source voltage $V_{gs1}$ at the rate $dV_{gs1}/dt = dV_{gate1}/dt - dV_{gate2}/dt$. This can produce a displacement current flowing from the gate, $I_{disp1}$, that is given by $I_{disp1} = C_{gs}*(dV_{gate1}/dt - dV_{gate2}/dt)$, which can be detected as described below.

In accordance with this disclosure, a detection circuit (examples of which are described below with respect to FIGS. 6 and 8) can detect the current $I_{disp1}$ from the control terminal of the first electronic switch, e.g., $FET_1$, during a transition portion of a conduction sequence, and the controller 24 (FIG. 2) can adjust the control signal to the control terminal of the first electronic switch and establish the second portion of the conduction sequence in response to the detected current. For example, amplifier Amp1 can stop applying a voltage signal to the gate of $FET_1$, thereby turning off $FET_1$.

During the normal slew of the current into the gate terminal $gate_1$ of $FET_1$, the gate current $I_{gate1} = C_{ds1}*dV_{gate1}/dt$, which is normally small in magnitude compared to the charging currents. As $FET_2$ begins to control the slew rate at $V_{out}$, a displacement current $I_{disp1}$ can begin to flow out of the gate of $FET_1$, which can be detected by circuitry, e.g., circuitry within $Amp_1$. The ramp of $V_{gate1}$ can match the ramp at its non-inverting (terminal). At this point, a switch 106 at $I_{ramp1}$ can momentarily be opened so that $V_{ramp1}$ stops ramping, and the switch 104 at $I_{delta}$ can be opened so that the ramp at $V_{out}$ can return to the original ramp rate $dV_{out}/dt = I_{ramp}*C_{ramp}$. Once the voltage $V_{ramp2} = V_{ramp1} + V_{delta}$ the switch 108 at $I_{ramp2}$ can be closed to resume the tracking ramp at $V_{ramp1}$. This completes the gate exchange from $FET_1$ to $FET_2$ as the load current can now be fully sustained in $FET_2$.

Figure 6:
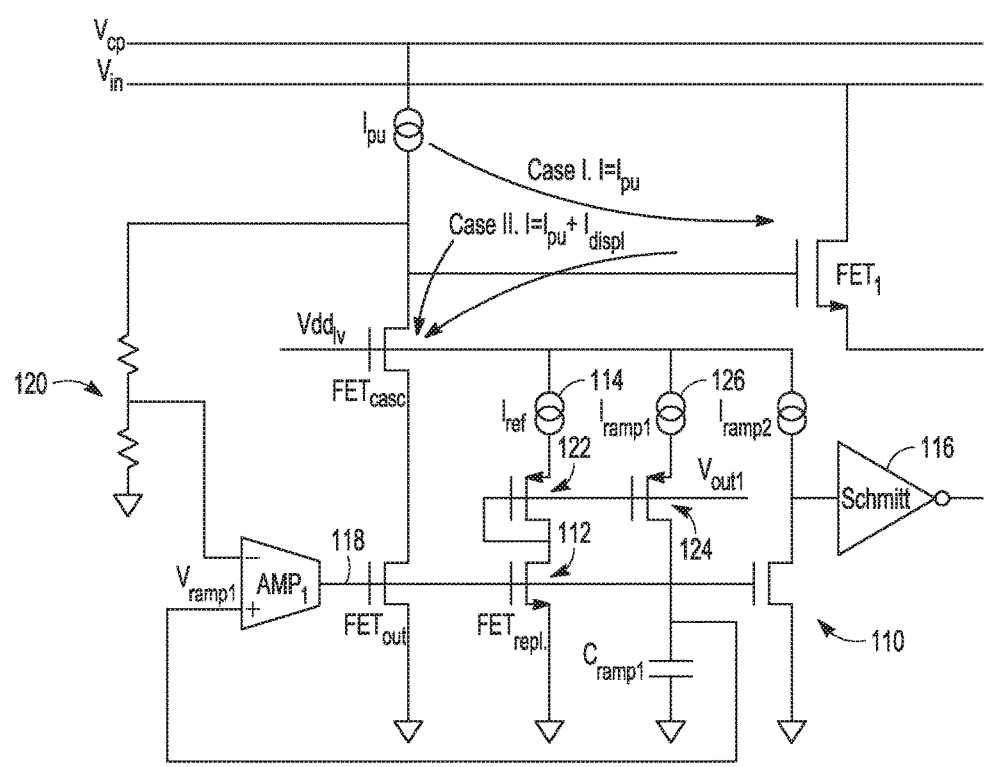
FIG. 6 is an example of a circuit for detecting currents from a control terminal of an electronic switch in accordance with this disclosure.

FIG. 6 is an example of a circuit for detecting currents from a control terminal of an electronic switch in accordance with this disclosure. The circuitry in FIG. 6 can be used to detect the current $I_{disp1}$ (FIG. 5) from the control terminal of the first electronic switch, e.g., $FET_1$, during a transition portion of a conduction sequence. The detection circuitry, shown generally at 110 of FIG. 6, can include a replica electronic switch 112 ($FET_{rep1}$), e.g., field-effect transistor, a reference current source 114 ($I_{ref}$) configured to provide a scaled current to the replica electronic switch 112, and a logic circuit 116, e.g., Schmitt trigger, configured to generate a logic signal. It should be noted that in some example configurations, at least some of the detection circuit in FIG. 6 can be incorporated in the amplifier Amp1 shown in FIGS. 4 and 5. The reference current source 114 ($I_{ref}$) can be low level, e.g., 1/10 of a fixed pull-up current source $I_{pu}$.

In FIG. 6, a voltage amplifier Amp1 (e.g., a portion of the amplifier Amp 1 shown in FIGS. 4 and 5) can include an output 118 connected to an output stage, e.g., cascaded output, that can include an open-drain FET ($FET_{out}$) with a cascode FET ($FET_{casc}$). The cascoded output can permit operation at higher power FET gate voltages with respect to ground potential. The inverting terminal (−) of the amplifier Amp1 can be connected to a feedback voltage divider 120 that can reduce the required input voltage range at the amplifier Amp1.

In this example of an analog implementation, an output of a fixed pull-up current source $I_{pu}$ connected to a charge pump $V_{cp}$, for example, can be connected to a control terminal of a switch, e.g., gate of $FET_1$, to generate a ramp current at the gate of $FET_1$ using $C_{ramp1}$. If the ramp current is such that the voltage $V_{ramp1}$ increases too quickly at $C_{ramp1}$, the ramp current can be reduced if there is a detectable condition. This "too quick" stage can be detected as an absence of current at $FET_{casc}$. The function of $I_{ref}$ 122 and $FET_{rep1}$ at this condition can be to have Iref 122 pull up on the gate voltage and thereby restrict the current through FET 124 and thus reduce the $I_{ramp1}$ and voltage slew rate at the top plate of $C_{ramp1}$. Very little current will be flowing into the replica FET $FET_{rep1}$ and, as such, a diode-connected FET 122, e.g., PMOS FET, may not be maintained in active conduction. This can cause the matching FET 124, e.g., PMOS FET, connected to the current source $I_{ramp1}$ to restrict the output ramp current. In addition, a fixed current source 126 can pull off the gate and slow down the current ramping. This configuration can provide a loop that can slow down the current ramping if it is increasing too quickly.

If the ramp current is increasing too slowly, however, the replica FET $FET_{rep1}$ can pull down enough current to keep the diode-connected FET 122 turned on. The current source $I_{ramp1}$ can determine what the ramp rate will be. If the ramp rate is slow enough where most of current is flowing through the cascode FET $FET_{casc}$, then the replica FET ($FET_{rep1}$) can pull down enough current to keep the diode-connected FET 122 and the output FET ($FET_{out}$) ON so that all of the ramp current is flowing.

If most of the pull-up current flows into $FET_1$, then very little current flows to the output FET ($FET_{out}$) and, as a result, the replica FET ($FET_{rep1}$) does not pull much current. So, the diode-connected FET 122 and the common-gate FET 124 will be OFF, which can reduce the $I_{ramp1}$ current.

To detect the current $I_{disp1}$ from the control terminal of the first electronic switch, e.g., $FET_1$, during a transition portion of a conduction sequence, there are two cases to consider. In case I, when there is no current $I_{disp1}$ from the control terminal of the first electronic switch, very little current flows to the output FET ($FET_{out}$) and, as a result, the replica FET ($FET_{rep1}$) does not pull much current. Case I is a state where all the current $I_{pu}$ is flowing to the gate of $FET_1$ and very little current is going in $FET_1$. This is a case of maximum ramp rate and the gate voltage of FET 122 will be pulled off, reducing the voltage ramp rate $V_{ramp}$ so that the gate voltage $V_{gate}$ of FET1 remains correlated to the $V_{ramp}$ signal.

In case II, when there is current $I_{disp1}$ from the control terminal of the first electronic switch, more current flows to the output FET ($FET_{out}$) than in case I. When the current to the output FET ($FET_{out}$) exceeds a value that can be the scaled equivalent of the pull-up current ($I_{pu}$)+a displacement current ($I_{disp1}$), where $I_{disp1}$ is a threshold level for the displacement current from the $FET_1$, the logic circuit 116, e.g., a Schmitt trigger, is high. In this manner, the detection circuit 110 can detect a current flowing from a control terminal of the first electronic switch during the transition portion of the conduction sequence. The logic circuit 116 is high when the FET exchange between $FET_1$ and $FET_2$, for example, has been completed. Then, the controller 24 (of FIG. 2) can adjust a control signal, e.g., turn OFF $FET_1$, and establish the second portion of the conduction sequence in response to the detected current, e.g., fully turn ON $FET_2$.

In some example implementations, it can be desirable to use digital techniques to implement a ramp generator. That is, instead of using the analog ramp generators described above, digital ramp generators can be used, as shown and described below with respect to FIGS. 7-9.

Figure 7:
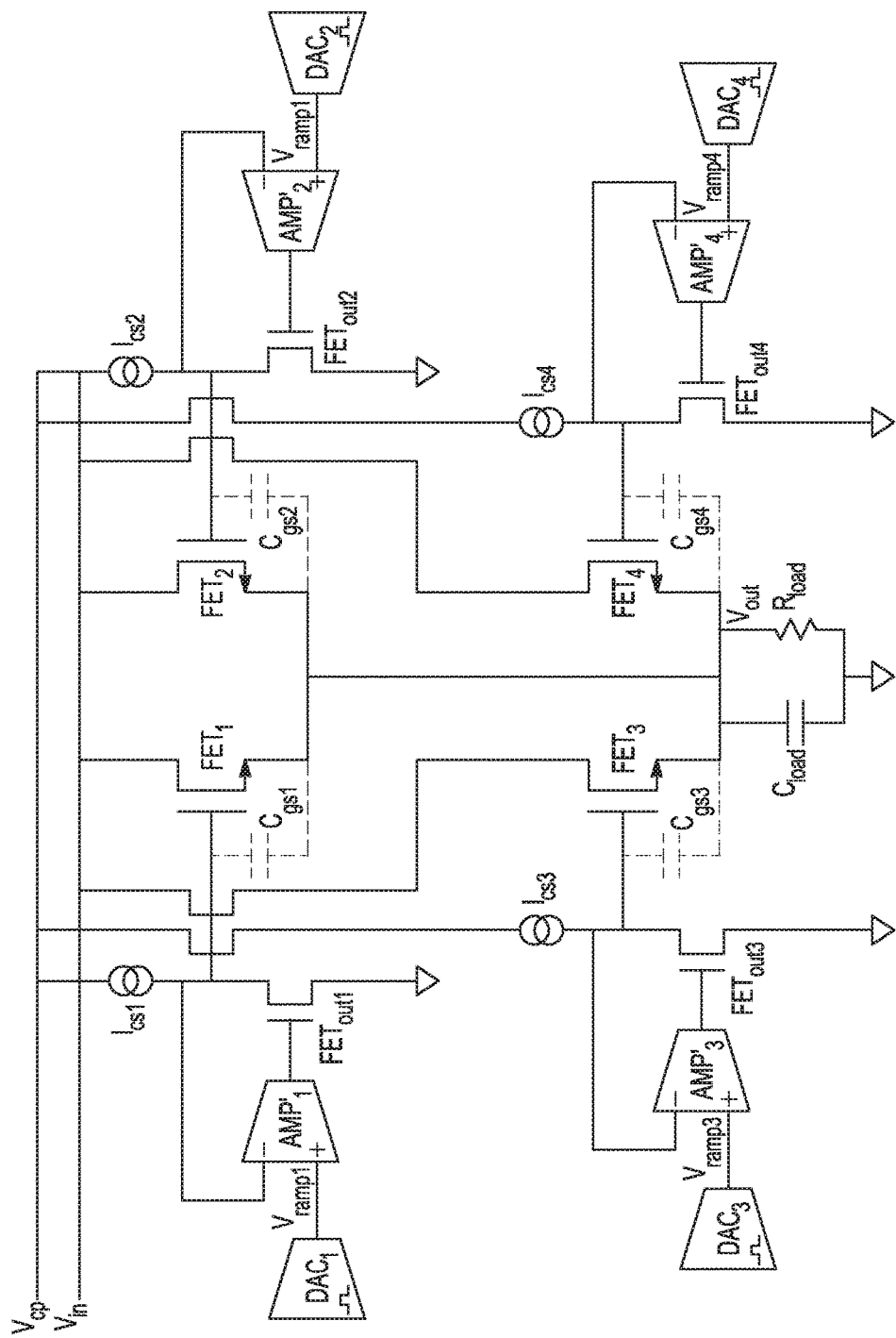
FIG. 7 is another example of a circuit that can be used to implement various techniques of this disclosure.

FIG. 7 is another example of a circuit that can be used to implement various techniques of this disclosure. In FIG. 7, time-sequenced digital ramp generators have replaced the analog ramp generators shown in FIGS. 4-6. In addition, FIG. 7 depicts a generalized application showing four FETs, rather than the two FETs shown in FIGS. 4-6.

In the example digital configuration shown in FIG. 7, the analog ramp generators of FIGS. 4-6 have been replaced by digital-to-analog converters (DACs) $DAC_1$-$DAC_4$ and the gate voltage amplifiers Amp1-Amp4 have been replaced with trans-conductance amplifiers Amp1'-Amp4'. $DAC_1$-$DAC_4$ can be four separate DACs, or four separate tap points on one DAC. Each trans-conductance amplifier, e.g., amplifier Amp1', can drive an output at a gate of one of the power FETs, e.g., $FET_1$, that can include a pull-up current source, e.g., current source $I_{CS1}$, and an output transistor, e.g., $FET_{out1}$. As an example configuration, the output transistors are depicted in a class-A configuration.

In the alternative arrangement for implementing the gate exchange technique shown in FIG. 7, $DAC_1$-$DAC_4$ can be clocked and used to produce an input voltage reference at each amplifier Amp1'-Amp4'. A controller 24 (FIG. 2) can be used to sequence the timing of $DAC_1$-$DAC_4$. Whether using an analog ramped reference or using a logic-driven digital implementation as in FIG. 7, each technique may have advantages and/or limitations. For example, the DAC approach of FIG. 7 can be used to eliminate the need for four separate timing capacitors that can be challenging to implement monolithically.

The amplifier arrangement shown in FIG. 7 is intended to illustrate another example approach. The use of a fixed pull-up current source, e.g., $I_{CS1}$, at each power FET gate in a class-A output configuration is basically equivalent to the previous representation of gate voltage amplifiers of FIGS. 4-6, but the output stage is now explicitly shown, along with the output stage of the amplifier. The gate voltage of the power FETs ($FET_1$-$FET_4$) will rise above the input voltage $V_{in}$ so the current sources $I_{CS1}$-$I_{CS4}$ feeding the gates of the power FETs ($FET_1$-$FET_4$) will source current from a supply voltage that is above the input voltage $V_{in}$. In the example of FIG. 7, this voltage is indicated as a charge pump voltage $V_{cp}$ because a convenient way of producing a voltage that is above $V_{in}$ may be with an integrated charge pump. This is an example technique for generating this voltage, but other techniques for generating an elevated gate voltage that allows the source voltage $V_{source}$ ($V_{out}$) to approach $V_{in}$ are possible.

While the amplifier output is shown as a class-A configuration with a fixed current source and common source output FET, other output stages can be constructed, such as a class AB output with common source output PFET connected to $V_{cp}$ and a common source output NFET connected to ground and both the drain of the PFET and NFET connected to the gate of the power FET. Finally, in the example shown in FIG. 7, the amplifiers Amp1'-Amp4' are shown in a unity-gain configuration, but in some example configurations, the feedback path to their respective inverting (−) terminals may include the use of a resistor divider to permit the use of lower voltage FETs at the input stage and a lower voltage range on the DAC.

Depending on the current of the pull-up current sources $I_{CS1}$-$I_{CS4}$ and the size of output $FET_{out1}$-$FET_{out4}$, the initial charging current that increases the gate-to-source voltage $V_{gs}$ of the power FETs to the threshold voltage $V_{th}$ may not be sufficient to permit the gate to slew at the intended ramp rate of the DACs (or analog ramp generators, if applicable). In this case, the entire pull-up current can be diverted to the gate of the power FET, e.g., $FET_1$, as the output FET, e.g., $FET_{out1}$, of the amplifier, e.g., Amp1', turns off.

Similar to what was described above with respect to FIG. 6, the circuit can detect this condition in the amplifier, e.g., Amp1', and use that information to adjust the initial ramp rate of the DAC (or analog ramp generator) for an altered ramp rate that can remain within the charging capability of the fixed pull-up current source. In the case of the DAC, an example configuration can include a reference current source and a replica electronic switch, e.g., NFET, that can serve as a proxy for the output stage. This configuration can act as a comparator that can detect a state of low-pull down current in the amplifier output FET and output the resulting logic signal to inhibit the DAC count advance. An example detection circuit is shown in FIG. 8.

Figure 8:
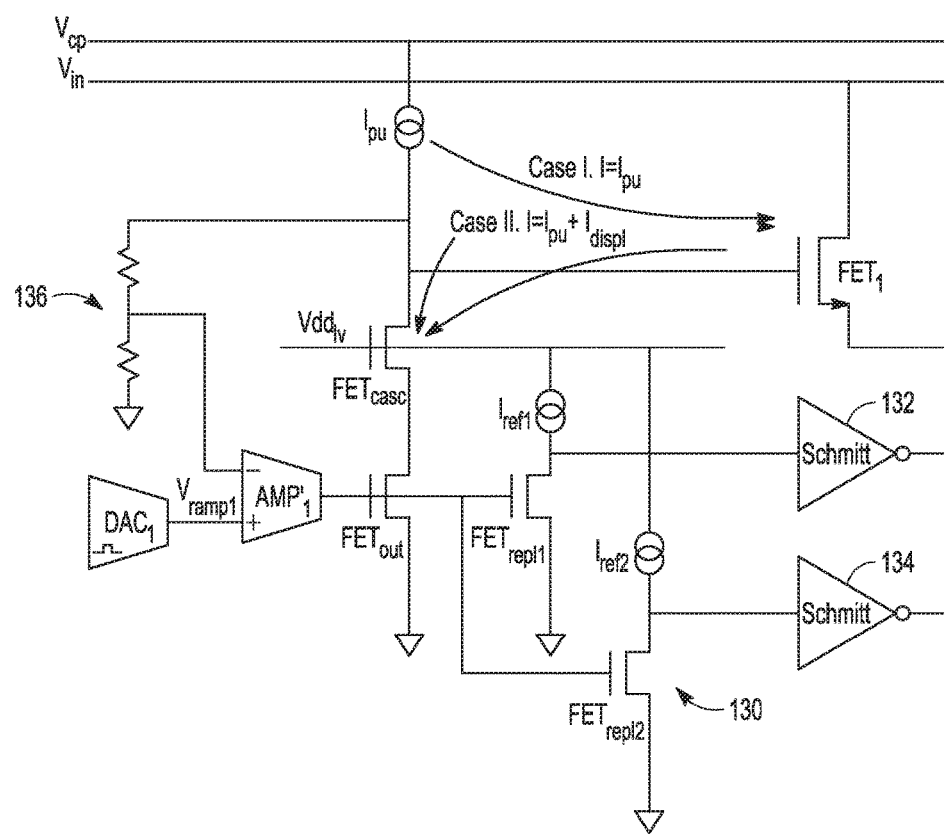
FIG. 8 is an example of a circuit for detecting currents from a control terminal of an electronic switch in accordance with this disclosure.

FIG. 8 is an example of a circuit for detecting currents from a control terminal of an electronic switch in accordance with this disclosure. The circuitry in FIG. 8, like the circuitry in FIG. 6, can be used to detect the current $I_{disp1}$ from the control terminal of the first electronic switch, e.g., $FET_1$, during a transition portion of a conduction sequence. The detection circuitry 130 of FIG. 8 can include first and second replica electronic switches $FET_{repl1}$, $FET_{repl2}$, e.g., field-effect transistors, first and second reference current sources $I_{ref1}$, $I_{ref2}$ configured to provide scaled currents to first and second replica electronic switches $FET_{repl1}$, $FET_{repl2}$ and first and second logic circuits 132, 134, e.g., Schmitt triggers, configured to generate logic signals in response to detected current. The replica circuitry can serve as a proxy for the output stage. It should be noted that in some example configurations, at least some of the detection circuit in FIG. 6 can be incorporated in the amplifier Amp1' shown in FIG. 7. In some examples, the logic threshold levels can be determined by the ratio of replica currents and replica FET sizes.

FIG. 8 can also include a feedback voltage divider 136 that can reduce the input voltage range at the amplifier Amp1'. The amplifier Amp1' can include an output connected to an output stage, e.g., cascaded output, that can include an open-drain FET ($FET_{out}$) and a cascode FET ($FET_{casc}$). The cascoded output can permit operation at higher power FET gate voltages with respect to ground potential. In this example of a digital ramp generator implementation, an output of a fixed pull-up current source $I_{pu}$ from a charge pump $V_{cp}$, for example, can be connected to a control terminal of switch, e.g., gate of $FET_1$ and the amplifier Amp1' can track a voltage from $DAC_1$.

To detect the current $I_{disp1}$ from the control terminal of the first electronic switch, e.g., $FET_1$, during a transition portion of a conduction sequence, there are two cases to consider. Case I is a case where the desired ramp rate exceeds the capability of the pull up current, which may occur during an exchange. Case I is intended to recognize when a maximum rate is exceeded and provide a feedback (either analog or logic) that permits the ramp rate at the non-inverting terminal of the amplifier to remain within the capability of the system. If the gate ramp rate is slow enough or the current $I_{pu}$ is of sufficient amount, substantial ramp rates can occur that will not trigger Case I.

In case I, when there is no current $I_{disp1}$ from the control terminal of the first electronic switch, very little current flows to the output FET ($FET_{out}$) and, as a result, the first replica FET ($FET_{repl1}$) does not pull much current. In this case, the output of the logic circuit 132, e.g., Schmitt trigger, is low when the pull-up current $I_{pu}$ charges the gate of the power FET, e.g., $FET_1$. When all of the pull-up current $I_{pu}$ is flowing into the gate of $FET_1$, $DAC_1$ cannot be tracked any faster. The logic circuit 132 generates a logic signal, e.g., low, to the controller 24 (FIG. 2) that indicates that $DAC_1$ is moving at the maximum rate.

In case II, when there is current $I_{disp1}$ from the control terminal of the first electronic switch, more current flows to the output FET ($FET_{out}$) than in case I. The logic circuit 134 can generate a logic signal, e.g., high, to the controller 24 (FIG. 2) when current in the output FET ($FET_{out}$) exceeds that can be the scaled equivalent of the pull-up current ($I_{pu}$)+a displacement current ($I_{disp1}$), where $I_{disp1}$ is a threshold level for the displacement current from the $FET_1$. In this manner, the detection circuit can detect a current flowing from a control terminal of the first electronic switch during the transition portion of the conduction sequence. The logic circuit 134 is high when the FET exchange between $FET_1$ and $FET_2$, for example, has been completed. Then, the controller 24 (of FIG. 2) can adjust a control signal, e.g., turn OFF $FET_1$, and establish the second portion of the conduction sequence in response to the detected current, e.g., fully turn ON $FET_2$. The reference current sources $I_{ref1}$ and $I_{ref2}$ can be scaled depending on the ratio of FETs.

Figure 9:
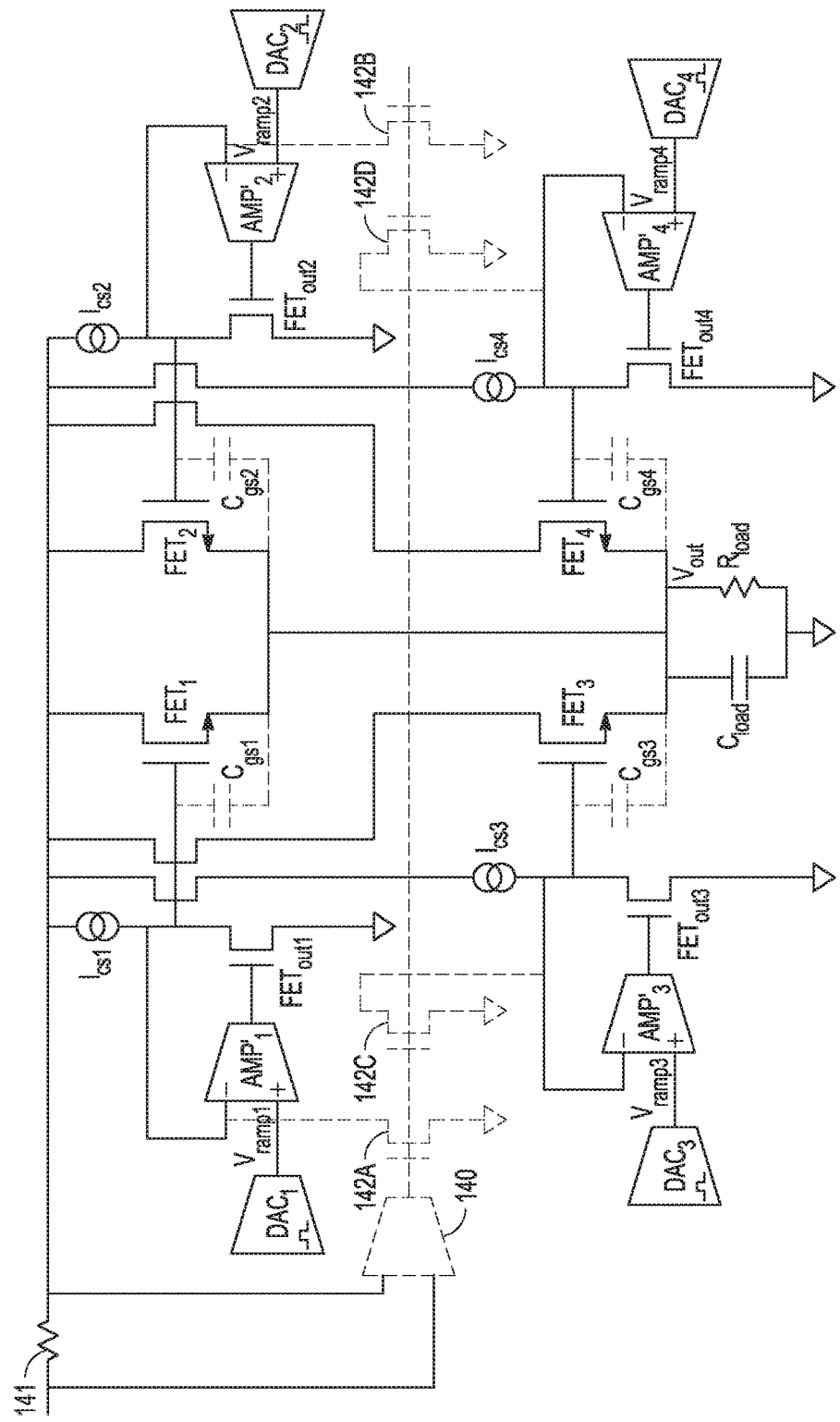
FIG. 9 is another example of a circuit that can implement various techniques of this disclosure.

FIG. 9 is another example of a circuit that can implement various techniques of this disclosure. Many aspects of FIG. 9 are similar to those shown and described in FIG. 7 and, for purposes of conciseness, will not be described in detail again.

The circuit in FIG. 9 includes parallel current limit circuitry, shown in dotted-line. The parallel current limit circuitry can pull down in parallel on the pull up currents $I_{CS1}$-$I_{CS4}$. When pulling down the main FET that is in control, e.g., $FET_1$, all the standby FETs, e.g., $FET_2$-$FET_4$, should also be pulled down or they could turn on without being controlled.

When current limiting is active, the dotted-line sense amplifier 140 connected to a sense resistor 141 can control the gate voltages of the power FETs ($FET_1$-$FET_4$). The detection circuits included in amplifiers Amp1'-Amp4' (described above with respect to FIG. 8, for example) can detect when current limiting is active because all the pull-up current $I_{pu}$ (not depicted in FIG. 9) is diverted into the current limit FETs 142A-142D. So, if $FET_1$ is in control, for example, the gate voltages of $FET_2$-$FET_4$ can be maintained below the gate voltage of the FET in control. When the gate exchange is active, the gate voltage of the next-in-sequence FET, e.g., $FET_2$, can be advanced under control of its respective amplifier, e.g., Amp2'.

The exchange can be completed when the pull-down current in the dotted-line current limiting amplifier 140 exceeds a threshold. At this point, the voltage advance of the next-in-sequence FET (e.g., $FET_2$) can be halted, the next-in-sequence FET (e.g., $FET_2$) can become the main FET in control, and the gate voltage of the original main FET (e.g., $FET_1$) can be lowered to a staging voltage.

Figure 10:
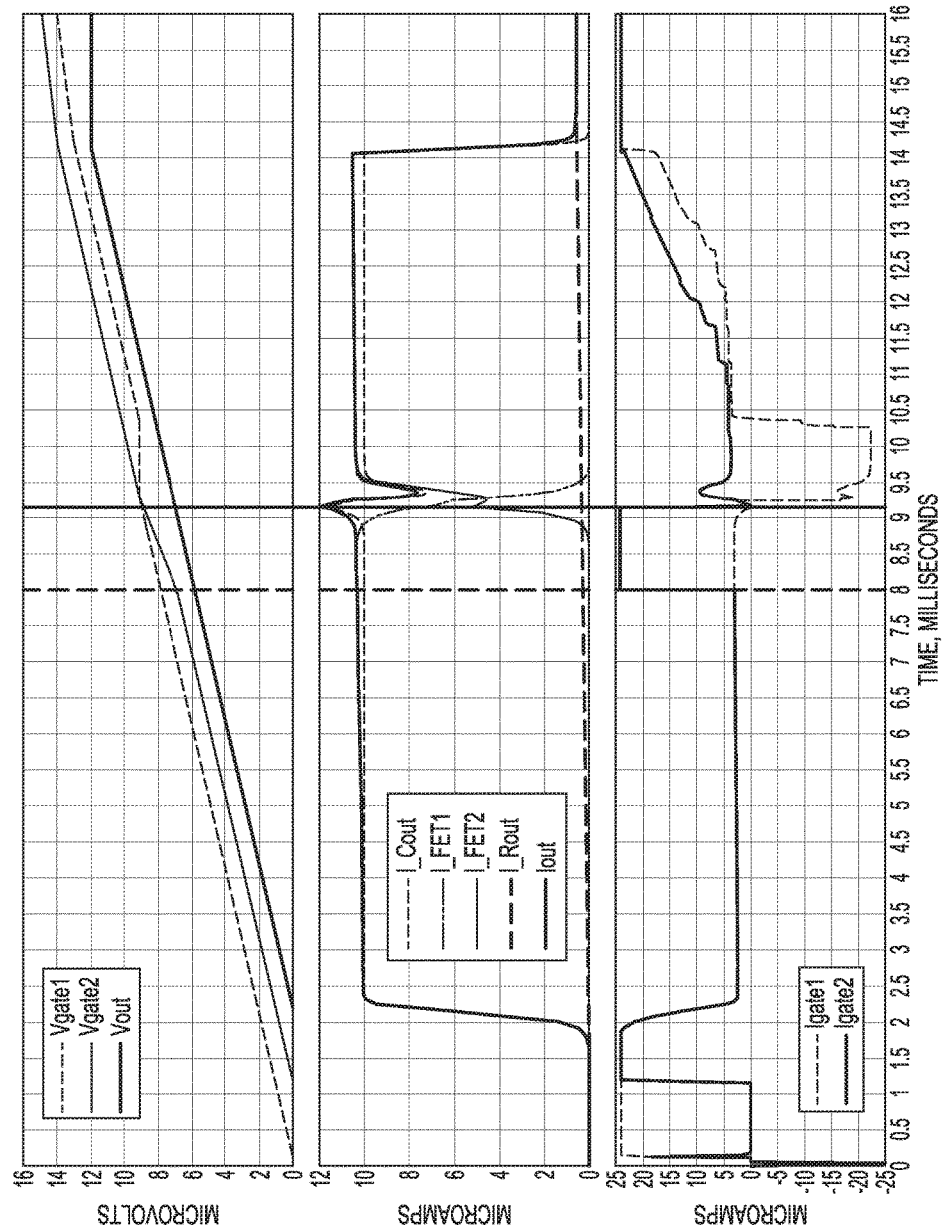
FIG. 10 shows graphs depicting simulation results using the switch exchange techniques of this disclosure.

FIG. 10 shows graphs depicting simulation results using the switch exchange techniques of this disclosure. FIG. 10 includes three composite plots generated using a circuit similar to FIG. 8. The top plot depicts the gate and output voltages for $FET_1$ and $FET_2$. The dotted-line trace is the gate voltage on $FET_1$ ($V_{gate1}$), the solid-line trace is the gate voltage on $FET_2$ ($V_{gate2}$), and the bolded-line trace is the voltage at the load ($V_{out}$). The load used to generate the graphs includes a parallel combination of a 1 kiloohm resistor and a 10 millifarad (mf) capacitor. The exchange from $FET_1$ and $FET_2$ is initiated at a time of 8 milliseconds (ms) and is marked with the dotted vertical line. The exchange completion is initiated at the bolded vertical line where the current from the gate of $FET_1$ changes polarity from positive to negative. The gate exchange is completed when the dotted-line trace for the gate voltage on $FET_1$ resumes the positive ramp at approximately 10.4 ms.

The middle plot of FIG. 10 depicts FET currents I_FET1, I_FET2 and load currents I_Cout, I_Rout, and Iout. As seen in the middle plot, after the gate exchange has been completed at the bolded vertical line, the load current has been transferred from $FET_1$ to $FET_2$ (I_FET1 decreases to 0 while I_FET2 increases). There can be about a 20% transient current increase and decrease in the capacitive load as the slew rate at $V_{out}$ briefly changes, but the effect on the output voltage is minimal.

The bottom plot shows the gate currents of $FET_1$ and $FET_2$, namely Igate1 and Igate2. During the period before 2 ms, a maximum gate current of 24 uA flows in both gates to initially charge the voltage $V_{gate1}$ to threshold voltage $V_{th}$ and $V_{gate2}$ to $V_{th}$-$V_{delta}$. After about 2 ms, the current falls in both gates to support the smaller charging requirement of $V_{ds}$. At about 8 ms, the gate current of $I_{gate1}$ is increased to about 24 uA to increase the slew rate at $V_{gate2}$ to intersect $V_{gate}$. When the polarity change at $I_{gate1}$ is detected, the original ramp rate is restored, while the current ramp at $FET_1$ is briefly halted until $V_{gate1}$ intercepts the original trajectory of $V_{gate2}$.

Figure 11:
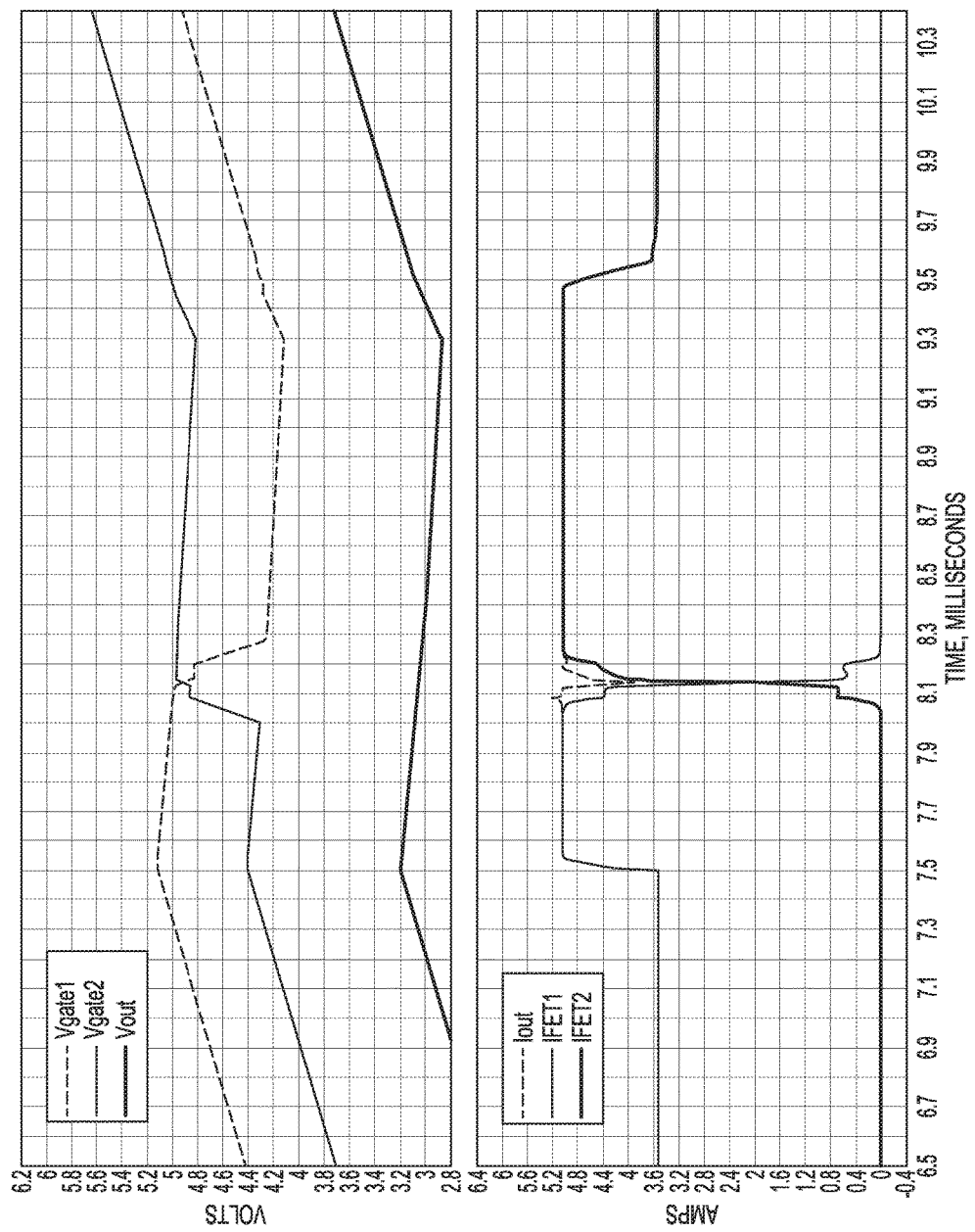
FIG. 11 shows graphs depicting simulation results using the switch exchange techniques of this disclosure.

FIG. 11 shows graphs depicting simulation results using the switch exchange techniques of this disclosure. FIG. 11 includes two composite plots. The top plot depicts the respective gate voltages and output voltage, and the bottom plot depicts the FET currents and output current for a simulated FET exchange in current limit. At t=7.5 ms, an overload is applied and a current limit circuit limits the total FET current to about 5 A, as seen in the bottom plot. At t=8 ms, the gate exchange is initiated with acceleration of the ramp of $FET_2$, as seen in the top plot. A small rise in total current is detected in the current limit amplifier as an excess pull-down current, which indicates that $FET_2$ is beginning to share current. At this point, the gate voltage of the first FET, $FET_1$, is decreased further and the gate voltage of $FET_2$ is increased so that the part again enters current limit, as seen in the top plot.

Various Examples and Notes

Example 1 includes subject matter (such as a circuit, device, apparatus, or machine) for controlling at least two electronic switches in a parallel configuration between a power supply and a load, the circuit comprising: a control circuit configured to: generate a first control signal to control a first electronic switch of the at least two electronic switches; generate a second control signal to control a second electronic switch of the at least two electronic switches; and establish a conduction sequence of the first and second electronic switches using the first and second control signals, the conduction sequence including: a first portion during which the first electronic switch conducts at least some of a current from the power supply to the load, a second portion during which the second electronic switch conducts at least some of the current from the power supply to the load, and a transition portion between the first and second portion during which both the first and second electronic switches conduct at least some of the current from the power supply to the load; and a detection circuit configured to detect a current flowing through a control terminal of the first electronic switch during the transition portion, and wherein the circuit is configured to adjust the first control signal and establish the second portion of the conduction sequence in response to the detected current.

In Example 2, the subject matter of Example 1 can optionally include, wherein the detection circuit includes: a first replica electronic switch; a first current source configured to provide a first scaled current to the first replica electronic switch; and a first logic circuit in communication with the first replica electronic switch, the first logic circuit configured to generate a first logic signal, wherein the control circuit is configured to receive the first logic signal and to adjust the first control signal and establish the second portion of the conduction sequence in response to the detected current.

In Example 3, the subject matter of Example 2 may optionally include, wherein the first logic signal has a first level when the current is flowing from the control terminal of the first electronic switch, and wherein the detection circuit includes: a second replica electronic switch; a second current source configured to provide a second scaled current to the second replica electronic switch; and a second logic circuit in communication with the second replica electronic switch, the second logic circuit configured to generate a second logic signal having a second level when the current is not flowing from the control terminal of the first electronic switch, wherein the control circuit is configured to receive the second logic signal and maintain the first control signal.

In Example 4, the subject matter of Example 3 may optionally include, wherein the first replica electronic switch includes a first replica field-effect transistor and the second replica electronic switch includes a second replica field-effect transistor.

In Example 5, the subject matter of one or more of Examples 1-4 may optionally include, a first amplifier in communication with the control terminal of the first electronic switch, wherein the first amplifier includes the detection circuit; a second amplifier in communication with the control terminal of the second electronic switch; a first analog ramp generator in communication with an input terminal of the first amplifier and configured to provide a first slew rate to the first electronic switch; and a second analog ramp generator in communication with an input terminal of the second amplifier and configured to provide a second slew rate to the second electronic switch.

In Example 6, the subject matter of Example 5 may optionally include, wherein the first amplifier is a first voltage amplifier, and wherein the second amplifier is a second voltage amplifier.

In Example 7, the subject matter of one or more of Examples 1-4 may optionally include, a first amplifier in communication with the control terminal of the first electronic switch, wherein the first amplifier includes the detection circuit; a second amplifier in communication with the control terminal of the second electronic switch; a first digital ramp generator in communication with an input terminal of the first amplifier and configured to provide a first slew rate to the first electronic switch; and a second digital ramp generator in communication with an input terminal of the second amplifier and configured to provide a second slew rate to the second electronic switch.

In Example 8, the subject matter of Example 7 may optionally include, wherein the first digital ramp generator includes a first digital-to-analog converter, and wherein the second digital ramp generator includes a second digital-to-analog converter.

In Example 9, the subject matter of one or more of Examples 1-8 may optionally include, wherein the first electronic switch includes a first field-effect transistor, wherein the second electronic switch includes a second field-effect transistor, and wherein the control terminal of the first electronic switch includes a gate terminal.

In Example 10, the subject matter of one or more of Examples 1-9 may optionally include, wherein the first control signal to control the first electronic switch is configured to vary between establishing a cut-off state and a fully-on-state of the first electronic switch, and wherein the second control signal to control the second electronic switch is configured to vary between establishing a cut-off state and a fully-on state of the second electronic switch.

Example 11 includes subject matter (such as a method, means for performing acts, machine readable medium including instructions that when performed by a machine cause the machine to performs acts, or an apparatus configured to perform) for controlling at least two electronic switches in a parallel configuration between a power supply and a load, the method comprising: establishing a conduction sequence of a first electronic switch of the at least two electronic switches and a second electronic switch of the at least two electronic switches using first control signal in communication with the first electronic switch and a second control signal in communication with the second control signal, the conduction sequence including: a first portion during which the first electronic switch conducts at least some of a current from the power supply to the load, a second portion during which the second electronic switch conducts at least some of the current from the power supply to the load, and a transition portion between the first and second portion during which both the first and second electronic switches conduct at least some of the current from the power supply to the load; and detecting a current flowing through a control terminal of the first electronic switch during the transition portion; and adjusting the first control signal and establishing the second portion of the conduction sequence in response to the detected current.

In Example 12, the subject matter of Example 11 may optionally include, providing a first replica electronic switch, wherein detecting a current flowing from a control terminal of the first electronic switch during the transition portion includes: generating a first logic signal using a first logic circuit in communication with the first replica electronic switch in response to a first replica current through the first replica electronic switch.

In Example 13, the subject matter of Example 12 may optionally include, wherein the logic signal is a first logic signal, wherein the first logic signal has a first level when the current is flowing from a terminal of the first electronic switch, the subject matter comprising: providing a second replica electronic switch, wherein detecting a current flowing from a control terminal of the first electronic switch during the transition portion includes: generating a second logic signal having a second level using the logic circuit in communication with the second replica electronic switch in response to a second replica current through the second electronic switch.

In Example 14, the subject matter of Example 13 may optionally include, wherein the first replica electronic switch includes a first replica field-effect transistor and the second replica electronic switch includes a second replica field-effect transistor.

In Example 15, the subject matter of one or more of Examples 11-14 may optionally include, providing a first amplifier in communication with the control terminal of the first electronic switch; providing a second amplifier in communication with the control terminal of the second electronic switch; providing a first analog ramp generator in communication with an input terminal of the first amplifier; providing a second analog ramp generator in communication with an input terminal of the second amplifier; generating, using the first analog ramp generator, a first slew rate to the first electronic switch; and generating, using the second analog ramp generator, a second slew rate to the second electronic switch.

In Example 16, the subject matter of Example 15 may optionally include, wherein the second amplifier is a second voltage amplifier.

In Example 17, the subject matter of Example 11-14 may optionally include, providing a first amplifier in communication with the control terminal of the first electronic switch; providing a second amplifier in communication with the control terminal of the second electronic switch; providing a first digital ramp generator in communication with an input terminal of the first amplifier and configured to provide a first slew rate to the first electronic switch; providing a second digital ramp generator in communication with an input terminal of the second amplifier and configured to provide a second slew rate to the second electronic switch; generating, using the first digital ramp generator, a first slew rate to the first electronic switch; and generating, using the second digital ramp generator, a second slew rate to the second electronic switch.

In Example 18, the subject matter of Example 17 may optionally include, wherein the first digital ramp generator includes a first digital-to-analog converter, and wherein the second digital ramp generator includes a second digital-to-analog converter.

In Example 19, the subject matter of one or more of Examples 11-18 may optionally include, wherein the first electronic switch includes a first field-effect transistor, wherein the second electronic switch includes a second field-effect transistor, and wherein the control terminal of the first electronic switch includes a gate terminal.

In Example 20, the subject matter of one or more of Examples 11-19 may optionally include, varying the first control signal between establishing a cut-off state and a fully-on-state of the first electronic switch, and varying the second control signal between establishing a cut-off state and a fully-on state of the second electronic switch.

In Example 21, the subject matter of one or more of Examples 1-10 may optionally include, wherein the detection circuit configured to detect a current flowing through a control terminal of the first electronic switch during the transition portion does not include a system current sensing resistor.

In Example 21, the subject matter of one or more of Examples 1-10 and 21 may optionally include, wherein the first and second electronic switches include any two of the at least two electronic switches.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. A circuit for controlling at least first and second electronic switches in a parallel configuration between a power supply and a load, each of the first and second electronic switches controlled by corresponding first and second control signals, the circuit comprising:
   a control circuit configured to
      establish a conduction sequence of the first and second electronic switches using the first and second control signals, the conduction sequence including:
         a transition portion during which both the first and second electronic switches conduct at least some current from the power supply to the load; and
      a detection circuit configured to detect a current flowing through a control terminal of the first electronic switch during the transition portion, and
      wherein the control circuit is configured to adjust the first control signal and establish another portion of the conduction sequence in response to the detected current.

2. The circuit of claim 1, wherein the conduction sequence includes:
   a first portion during which the first electronic switch conducts the at least some current from the power supply to the load, and
   a second portion during which the second electronic switch conducts the at least some current from the power supply to the load, and
   wherein the detection circuit includes:
      a first replica electronic switch;
      a first current source configured to provide a first scaled current to the first replica electronic switch; and
      a first logic circuit in communication with the first replica electronic switch, the first logic circuit configured to generate a first logic signal,
      wherein the control circuit is configured to receive the first logic signal and to adjust the first control signal and establish the second portion of the conduction sequence in response to the detected current.

3. The circuit of claim 2, wherein the first logic signal has a first level when the current is flowing from the control terminal of the first electronic switch, and wherein the detection circuit includes:
   a second replica electronic switch;
   a second current source configured to provide a second scaled current to the second replica electronic switch; and
   a second logic circuit in communication with the second replica electronic switch, the second logic circuit configured to generate a second logic signal having a second level when the current is not flowing from the control terminal of the first electronic switch,
   wherein the control circuit is configured to receive the second logic signal and maintain the first control signal.

4. The circuit of claim 3, wherein the first replica electronic switch includes a first replica field-effect transistor and the second replica electronic switch includes a second replica field-effect transistor.

5. The circuit of claim 1, comprising:
   a first amplifier in communication with the control terminal of the first electronic switch;
   a second amplifier in communication with the control terminal of the second electronic switch;
   a first analog ramp generator in communication with an input terminal of the first amplifier and configured to provide a first slew rate to the first electronic switch; and
   a second analog ramp generator in communication with an input terminal of the second amplifier and configured to provide a second slew rate to the second electronic switch.

6. The circuit of claim 5, wherein the first amplifier is a first voltage amplifier, and wherein the second amplifier is a second voltage amplifier.

7. The circuit of claim 1, comprising:
   a first amplifier in communication with the control terminal of the first electronic switch, wherein the first amplifier includes the detection circuit;
   a second amplifier in communication with the control terminal of the second electronic switch;
   a first digital ramp generator in communication with an input terminal of the first amplifier and configured to provide a first slew rate to the first electronic switch; and
   a second digital ramp generator in communication with an input terminal of the second amplifier and configured to provide a second slew rate to the second electronic switch.

8. The circuit of claim 7, wherein the first digital ramp generator includes a first digital-to-analog converter, and wherein the second digital ramp generator includes a second digital-to-analog converter.

9. The circuit of claim 1, wherein the first electronic switch includes a first field-effect transistor, wherein the second electronic switch includes a second field-effect transistor, and wherein the control terminal of the first electronic switch includes a gate terminal.

10. The circuit of claim 1, wherein the first control signal to control the first electronic switch is configured to vary between establishing a cut-off state and a fully-on-state of the first electronic switch, and wherein the second control signal to control the second electronic switch is configured to vary between establishing a cut-off state and a fully-on state of the second electronic switch.

11. The circuit of claim 1, wherein the detection circuit configured to detect the current flowing through the control terminal of the first electronic switch during the transition portion does not include a system current sensing resistor.

12. The circuit of claim 1, wherein the first and second electronic switches include any two of the at least two electronic switches.

13. A method for controlling at least first and second electronic switches in a parallel configuration between a power supply and a load, the method comprising:
   establishing a conduction sequence of the first and second electronic switches by adjusting corresponding first and second control signals, the conduction sequence including
      a transition portion during which both the first and second electronic switches conduct at least some of the current from the power supply to the load;
   detecting a current flowing through a control terminal of the first electronic switch during the transition portion; and
   adjusting the first control signal and establishing another portion of the conduction sequence in response to the detected current.

14. The method of claim 13, comprising:
wherein detecting a current flowing from a control terminal of the first electronic switch during the transition portion includes:
generating a first logic signal using a first logic circuit in communication with a first replica electronic switch in response to a first replica current through the first replica electronic switch.

15. The method of claim 14, wherein the logic signal is a first logic signal, wherein the first logic signal has a first level when the current is flowing from a terminal of the first electronic switch, the method comprising:
wherein detecting a current flowing from a control terminal of the first electronic switch during the transition portion includes:
generating a second logic signal having a second level using the logic circuit in communication with a second replica electronic switch in response to a second replica current through the second electronic switch.

16. The method of claim 13, comprising:
generating, using a first analog ramp generator, a first slew rate to the first electronic switch; and
generating, using a second analog ramp generator, a second slew rate to the second electronic switch.

17. The method of claim 13, comprising:
generating, using a first digital ramp generator, a first slew rate to the first electronic switch; and
generating, using a second digital ramp generator, a second slew rate to the second electronic switch.

18. The method of claim 13, comprising:
varying the first control signal between establishing a cut-off state and a fully-on-state of the first electronic switch; and
varying the second control signal between establishing a cut-off state and a fully-on state of the second electronic switch.

19. A circuit for controlling at least first and second electronic switches in a parallel configuration between a power supply and a load, each of the first and second electronic switches controlled by corresponding first and second control signals, the circuit comprising:
means for establishing a conduction sequence of the first and second electronic switches by adjusting the first and second control signals, the conduction sequence including a transition portion during which both the first and second electronic switches conduct at least some of the current from the power supply to the load;
means for detecting a current flowing through a control terminal of the first electronic switch during the transition portion; and
means for adjusting the first control signal and establishing another portion of the conduction sequence in response to the detected current.

20. The circuit of claim 19, wherein the means for detecting a current flowing from the control terminal of the first electronic switch during the transition portion includes:
means for generating a first logic signal in communication with a first replica electronic switch in response to a first replica current through the first replica electronic switch.

21. The circuit of claim 19, further comprising:
means for generating a first slew rate to the first electronic switch; and
means for generating a second slew rate to the second electronic switch.

22. The circuit of claim 19, further comprising:
means for varying the first control signal between establishing a cut-off state and a fully-on-state of the first electronic switch; and
means for varying the second control signal between establishing a cut-off state and a fully-on state of the second electronic switch.

* * * * *